(12) United States Patent
Hussein et al.

(10) Patent No.: US 7,326,981 B2
(45) Date of Patent: Feb. 5, 2008

(54) METHODS AND APPARATUSES FOR PRODUCING A POLYMER MEMORY DEVICE

(75) Inventors: Makarem A. Hussein, Beaverton, OR (US); Ebrahim Andideh, Portland, OR (US); Peter K. Moon, Portland, OR (US); Daniel C. Diana, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 11/373,736

(22) Filed: Mar. 9, 2006

(65) Prior Publication Data

US 2006/0157764 A1    Jul. 20, 2006

Related U.S. Application Data

(62) Division of application No. 11/007,113, filed on Dec. 7, 2004, now Pat. No. 7,078,754, which is a division of application No. 10/688,085, filed on Oct. 17, 2003, now Pat. No. 6,900,063.

(51) Int. Cl.
    *H01L 29/76*    (2006.01)
    *H01L 29/94*    (2006.01)
    *H01L 31/062*   (2006.01)
    *H01L 31/113*   (2006.01)
    *H01L 31/119*   (2006.01)

(52) U.S. Cl. ............... 257/295; 257/622; 257/E21.009; 257/E21.104; 257/E21.158; 257/E21.208

(58) Field of Classification Search ............... 257/295, 257/330, 508, 510, 622; 438/3
    See application file for complete search history.

(56) References Cited

U.S. PATENT DOCUMENTS

| | | | |
|---|---|---|---|
| 6,495,878 B1 * | 12/2002 | Hayashi et al. | 257/310 |
| 6,624,457 B2 * | 9/2003 | Li et al. | 257/295 |
| 6,798,003 B2 * | 9/2004 | Li et al. | 257/295 |
| 6,900,063 B2 * | 5/2005 | Hussein et al. | 438/3 |
| 7,078,754 B2 * | 7/2006 | Hussein et al. | 257/295 |
| 2004/0214351 A1 * | 10/2004 | Agarwal et al. | 438/3 |

* cited by examiner

*Primary Examiner*—David Nhu
(74) *Attorney, Agent, or Firm*—Blakely, Sokoloff, Taylor & Zafman LLP

(57) ABSTRACT

Embodiments of the invention provide a method for producing ferroelectric polymer devices (FPMDs) employing conditions that avoid or reduce detrimental impact on the ferroelectric polymer film. For one embodiment, a damascene patterning metallization technique is used. For one embodiment a first metal layer is deposited on a substrate to form the bottom electrode for the FPMD. The first metal layer is capped with a selectively deposited diffusion barrier. A layer of ferroelectric polymer film is then deposited on the first conductive layer. The ferroelectric polymer film is planarized. A second metal layer is deposited on the ferroelectric polymer film layer to form the top electrode of the FPMD. The second metal layer is deposited such that the ferroelectric polymer film is not substantially degraded. For various alternative embodiments the various component processes may be accomplished at temperatures far below those employed in a conventional damascene patterning metallization process.

6 Claims, 5 Drawing Sheets

METHODS AND APPARATUSES FOR PRODUCING A POLYMER MEMORY DEVICE

CLAIM OF PRIORITY

This is a Divisional Application of Ser. No.: 11/007,113 filed Dec. 7, 2004, U.S. Pat. No. 7,078,754 which is a Divisional of Ser. No. 10/688,085 filed Oct. 17, 2003, now U.S. Pat. No. 6,900,063, issued May 31, 2005.

FIELD

Embodiments of the invention relate generally to the field of integrated circuit device manufacture and more particularly to the manufacture of memory devices.

BACKGROUND

Conventional methods of producing ferroelectric polymer memory devices (FPMDs) have a number of disadvantages that limit the quality and complexity of such devices. One method of producing FPMDs employs subtractive metal patterning techniques as known in the art. Such techniques introduce a high level of non-planarity to the substrate of the device and limit the patterning process as the number of layers of the device is increased.

A FPMD consists generally of a bottom electrode and a top electrode, both made of metal, having a ferroelectric polymer film (FPF) between them. An FPF is made of a polymer having the property of spontaneous electric polarization that can be reversed by application of an electric field. It is the FPF that constitutes the core of the memory bit for the FPMD. The difficulty of manufacturing FPMDs lies in patterning the electrodes without damaging or degrading the FPF in any way, and especially in not degrading the FPF in regard to its ferroelectric properties.

FIG. 1 illustrates a process employing a subtractive metal patterning technique in the context of FPMD production in accordance with the prior art. Process 100, shown in FIG. 1, begins at operation 105 in which a bottom electrode of a FPMD is formed on a substrate using a conventional subtractive metal patterning technique.

At operation 110 a layer of FPF is deposited upon the bottom electrode. The FPF is an extremely delicate material and can be easily degraded.

At operation 115 a metal (e.g., aluminum) layer is deposited upon the FPF to form the top electrode of the FPMD. Using subtractive metal patterning, the metal is deposited over the entire FPF layer, there is no ability to deposit the metal selectively.

At operation 120 the metal layer is etched using a resist mask to expose those areas to be etched and mask the desired pattern. The etching process is problematic for the production of FPMDs because the etching chemistry is typically very harsh and can degrade the FPF. For example, a typical aluminum etching employs a chlorine-based etchant that can have serious detrimental effects upon the ferroelectric properties of the FPF.

Moreover, to avoid corrosion of the metal layer, typical subtractive metal patterning techniques employ a significant amount of etch residues to protect the metal layer. These etch residues are difficult to remove, so cleaning up the metal layer is neither easy nor inexpensive.

Another important drawback of using a subtractive metal patterning process to produce FPMDs is the resultant non-planarity of the wafer surface.

FPMDs typically are constructed having 10-14 layers of metallization, or more. Prior art production techniques, including subtractive metal patterning introduce a non-planarity at each metallization layer. The cumulative effective of this non-planarity is that it becomes increasingly difficult to pattern at the upper layers. The increasing non-planarity of the wafer has a detrimental impact on the lithography and etch steps of metal patterning by reducing the process window. The non-planarity introduced through such techniques is typically greater than 30%.

For these and other reasons the production of FPMDs is limited by using non-optimal conventional metallization techniques such as subtractive metal patterning. Currently there is no cost-efficient method for producing FPMDs having a relatively large number of layers (i.e., ten or more layers).

BRIEF DESCRIPTION OF THE DRAWINGS

The invention may be best understood by referring to the following description and accompanying drawings that are used to illustrate embodiments of the invention. In the drawings.

DETAILED DESCRIPTION

Embodiments of the invention provide a method for producing FPMDs employing conditions that avoid or reduce detrimental impact on the FPF of the device. For one embodiment, a damascene patterning metallization technique is used. For such an embodiment, various component processes may be accomplished at temperatures far below those employed in a conventional damascene patterning metallization process.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1:
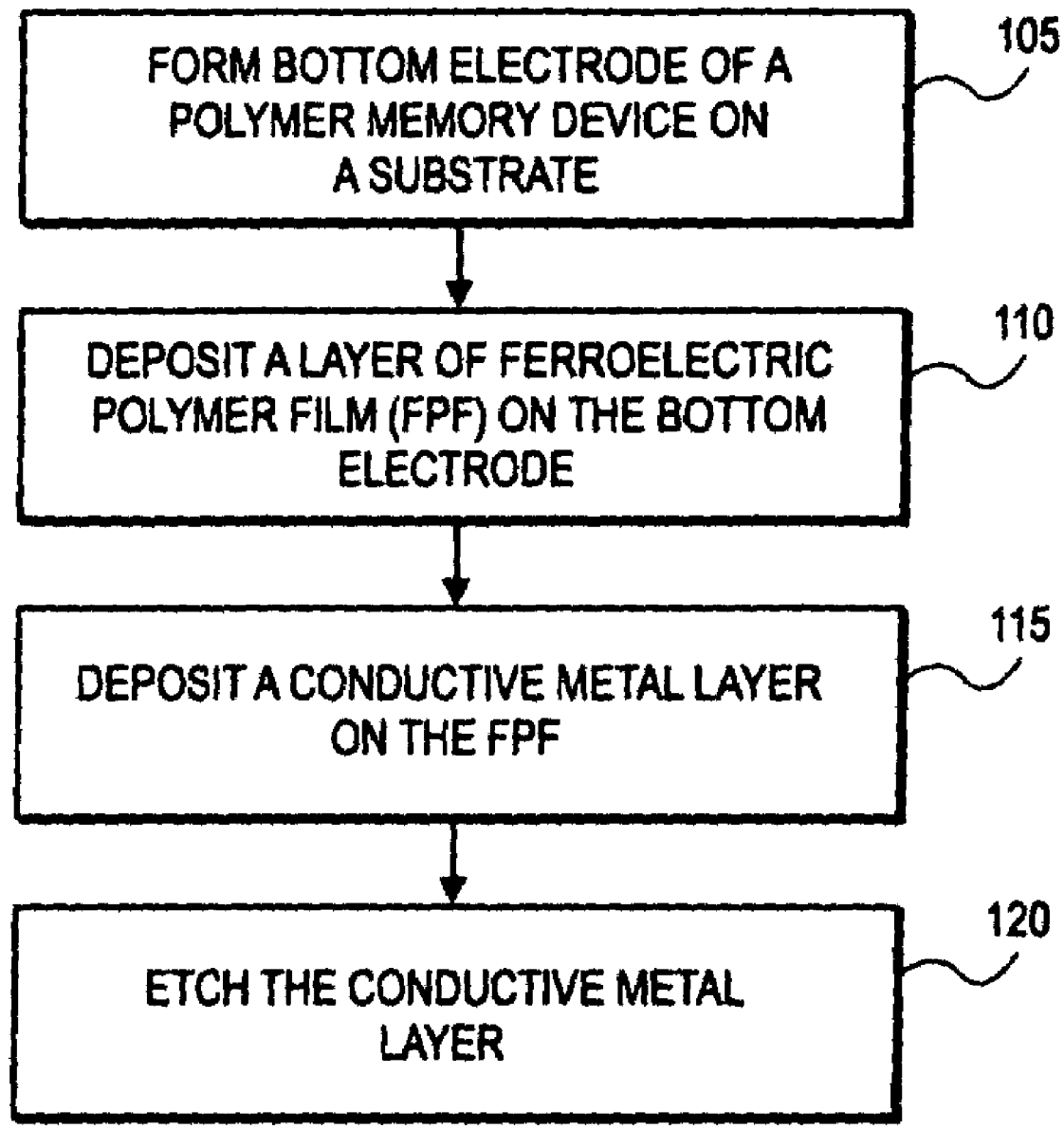
FIG. 1 illustrates a process employing a subtractive metal patterning technique in the context of FPMD production in accordance with the prior art.
Figure 2:
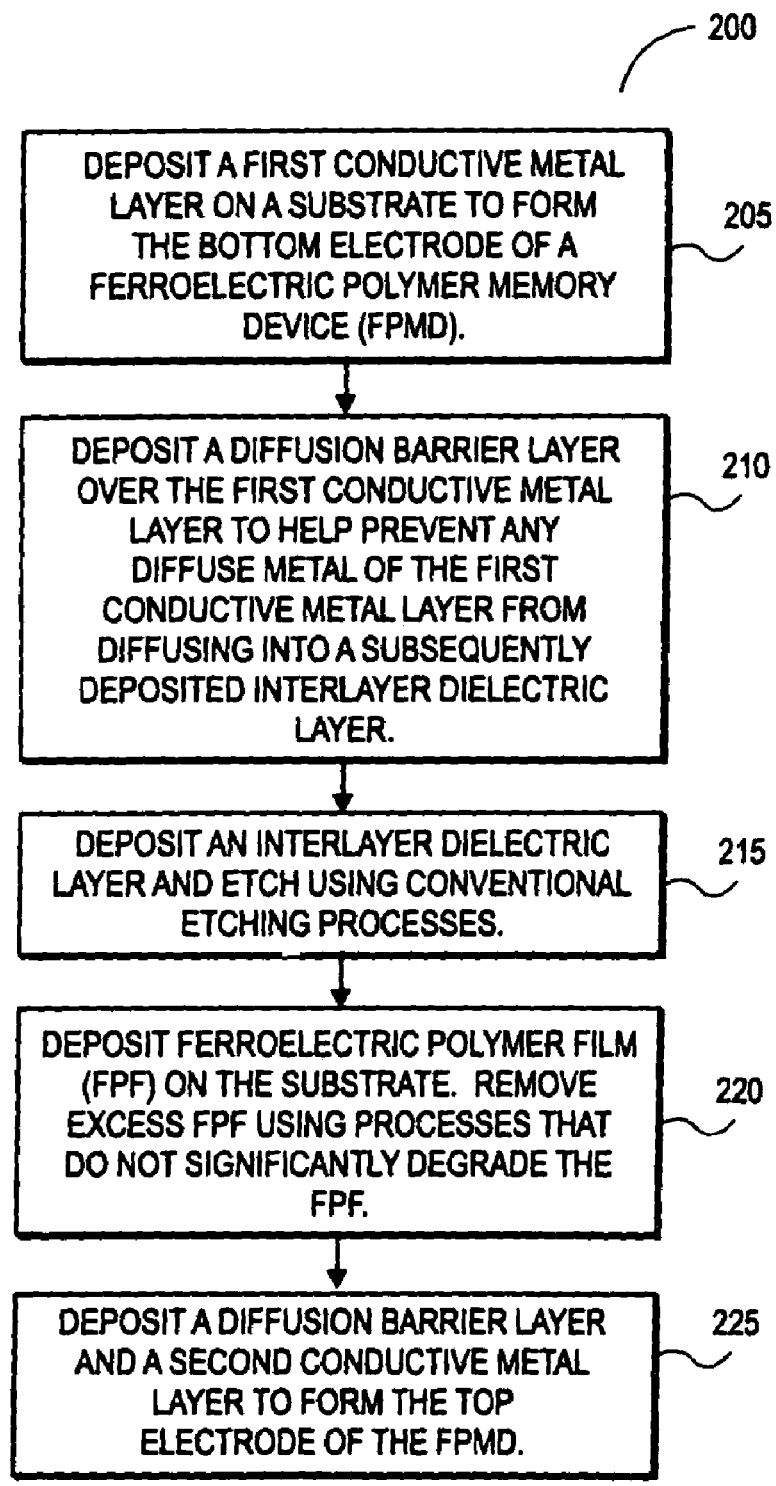
FIG. 2 illustrates a process for producing a FPMD in accordance with one embodiment of the invention.

FIG. 2 illustrates a process for producing a FPMD in accordance with one embodiment of the invention. Process 200, shown in FIG. 2, begins at operation 205 in which a first metal layer is deposited on a substrate. The first metal layer will form the bottom electrode of the FPMD. For one embodiment the first conductive layer is deposited using a conventional electroplating process. For one embodiment the substrate has, fabricated thereon, various conventional components (e.g., low-level CMOS transistors) prior to operation 205.

Figure 3:
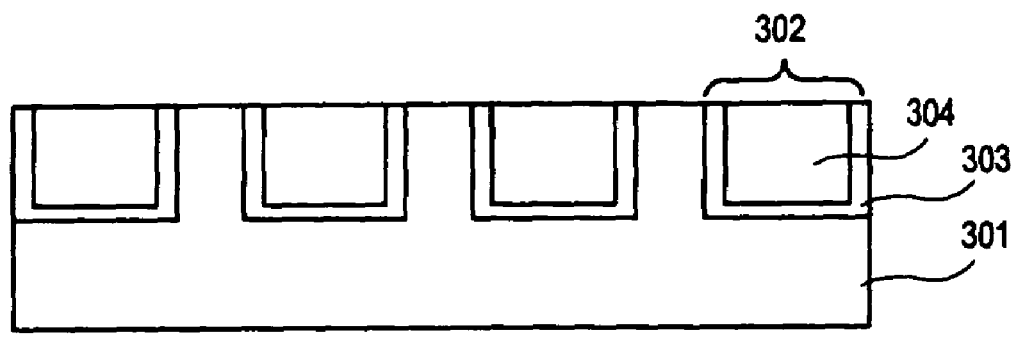
FIGS. 3-7 illustrate the intermediate structures produced during the production of a FPMD in accordance with one embodiment of the invention.

FIG. 3 illustrates the structure created by operation 205 of process 200. Structure 300, shown in FIG. 3, includes a substrate 301 which may be silicon, ceramic interlayer dielectric or other suitable material. The substrate 301 has a number of trenches etched in it, shown for example by trench 302. For the embodiment illustrated in FIG. 3, the trenches have deposited therein a barrier layer 303 and have been filled with metal 304 using a typical single damascene process. Barrier layer 303 is used to keep the metal (e.g., copper) from diffusing into the substrate. The metal 304 and the barrier layer 303 comprise the first metal layer (bottom electrode) of a FPMD.

Referring again to FIG. 2, at operation 210 the first metal layer is capped with a diffusion barrier layer to help reduce or prevent metal of the first metal layer from diffusing into a subsequently applied interlayer dielectric (ILD) and the FPF. The diffusion barrier layer is conductive and is selectively deposited. For one embodiment the diffusion barrier is deposited using a selective metallization process. For example, electroless plating may be used as the metal layer provides the necessary electron source to activate an electroless plating process. For one embodiment the diffusion barrier layer is cobalt. In alternative embodiments the diffusion barrier layer may be other metals or alloys that do not allow substantial diffusion of metal 304 into the ILD and are compatible with the FPF subsequently disposed upon the diffusion barrier layer (e.g., nickel). That is, the diffusion barrier layer is chosen such that it adheres well to the FPF and does not interact with, outgas or in other ways degrade the FPF.

Figure 4:
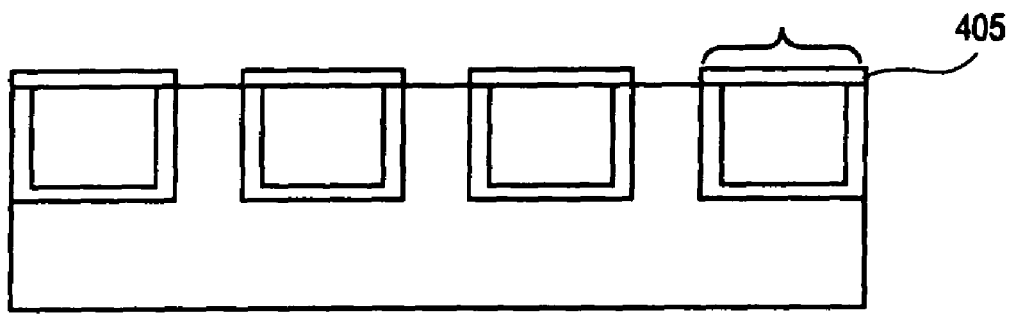

FIG. 4 illustrates the structure of FIG. 3 having a diffusion barrier layer 405 applied to the first metal layer.

Referring again to FIG. 2, at operation 215 the ILD is deposited and etched. In contrast to conventional methods of ILD deposition, the deposition of the ILD in accordance with one embodiment of the invention is accomplished at low temperatures (below approximately 130° C.) so as to avoid degrading the FPF in a multi-layer FPMD. A trench is then etched in the ILD using resist mask and conventional etching processes. The depth of the trench is equal to the thickness of the subsequently disposed FPF and the top electrode of the FPMD. Post etching cleaning is then performed with the diffusion barrier layer protecting the copper during both the etching and cleaning processes.

Figure 5:
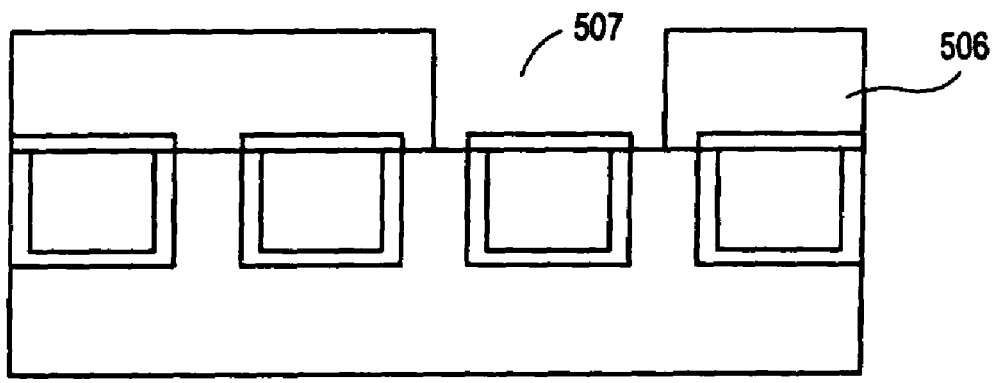

FIG. 5 illustrates the structure of FIG. 4 having an ILD layer 506 that has been etched to form a trench 507.

Referring again to FIG. 2, at operation 220 the FPF is disposed upon the substrate over the diffusion barrier layer. The FPF fills the trench and is planarized on the surface of the structure. The FPF is planarized to a tolerance of less than or equal to 10% of the trench depth, which allows for a multiple layer FPMD having an acceptably planar substrate. For one embodiment of the invention the planarity achieved is less than 5%. For one embodiment the FPF is deposited using a spin-coat process as known in the art. The excess FPF (FPF in excess of a desired thickness) is then removed. For one embodiment the excess FPF is removed using a low-temperature oxygen-based ash process. The low temperature oxygen-based ash process may be controlled to effect the desired thickness of the FPF within the trench to a specified tolerance. Exposure of the FPF to the oxygen plasma of the low temperature oxygen-based ash process does not significantly degrade the FPF or impact its performance. For other embodiments, alternative methods may be used including low-temperature chemical vapor deposition and evaporation of the FPF.

Figure 6:
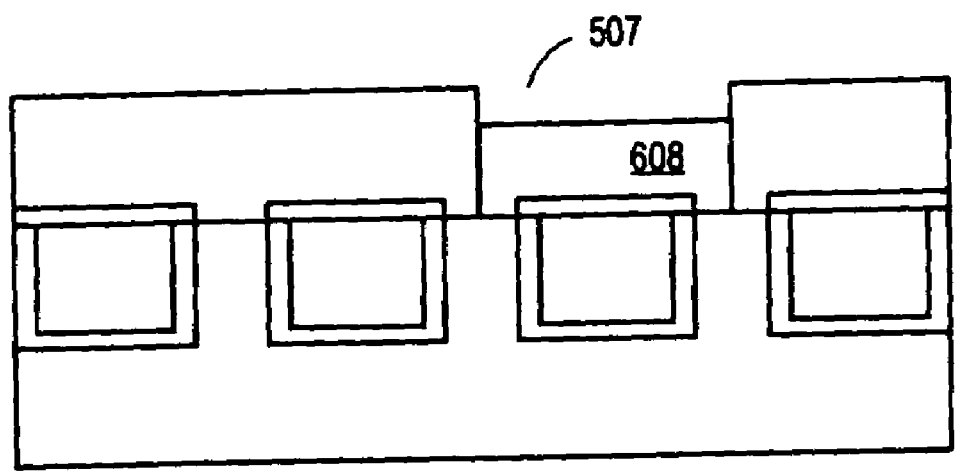

FIG. 6 illustrates the structure of FIG. 5 having a layer of FPF 608 deposited in the trench 507 using a process as described above.

Referring again to FIG. 2, at operation 225 the top electrode of the FPMD is formed over the FPF. A diffusion barrier layer is deposited on the substrate over the ILD layer and the FPF layer. This diffusion barrier layer helps to reduce or prevent diffusion of a subsequently deposited metal layer into either the ILD layer or the FPF. As discussed above, the diffusion barrier layer may be tantalum or tantalum nitride or cobalt, or other conductive materials that do not allow substantial diffusion of electrode metal into the ILD and FPF and are compatible with the FPF (e.g., nickel). For one embodiment the diffusion barrier layer is deposited using an evaporation process. For other alternative embodiments, the diffusion barrier layer may be deposited by other methods as known in the art that do not substantially degrade the FPF.

A second metal layer is then deposited to form the top electrode of the FPMD. For one embodiment in which the second conductive layer is deposited using an electroplating or electroless plating process, a seed layer is deposited on the diffusion barrier layer to facilitate the electroplating process. For example, a copper seed layer may be deposited upon the diffusion barrier layer to facilitate electroplating a copper layer to form the top electrode of the FPMD. The second metal layer is then polished using conventional techniques. Subsequent to the polishing process, the surface of the second metal layer is capped with a diffusion barrier layer.

Figure 7:
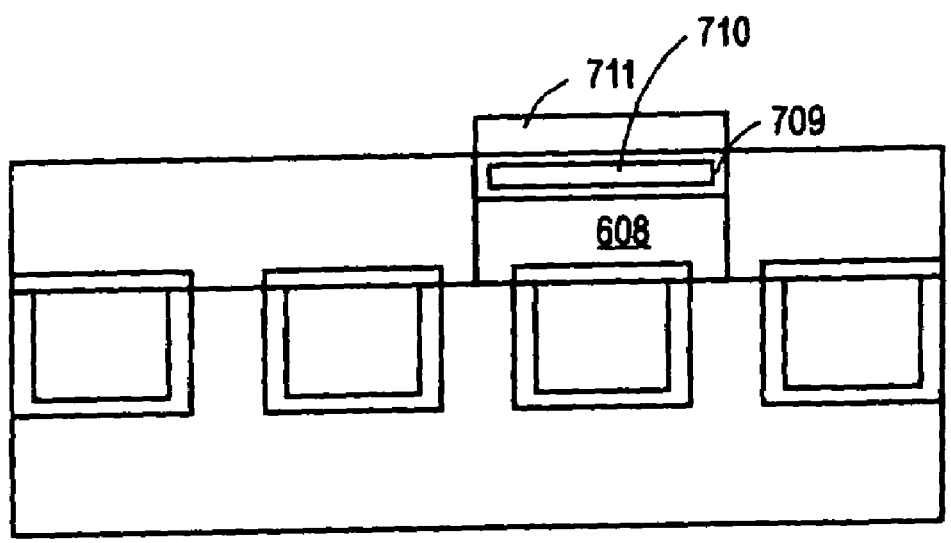

FIG. 7 illustrates the structure of FIG. 6 having a diffusion barrier layer 709 deposited upon the FPF 608 and a metal layer 710 deposited upon the diffusion barrier layer 709 to form the top electrode of a FPMD. The top electrode has been capped with diffusion barrier layer 711 as discussed above.

A subsequent metal layer is formed by repeating operations of process 200. After deposition of an ILD layer using a low-temperature process, vias between previous layers and the last metal layer of the memory block are formed. This may be accomplished using a trench-first dual damascene metallization technique.

After the dual damascene structure is formed, typical processing steps are performed including deposition of a diffusion barrier layer, seed layer, and metal layer (e.g., by electroplating), and polishing. This yields a functional memory block, structure 800 of FIG. 8.

Figure 8:
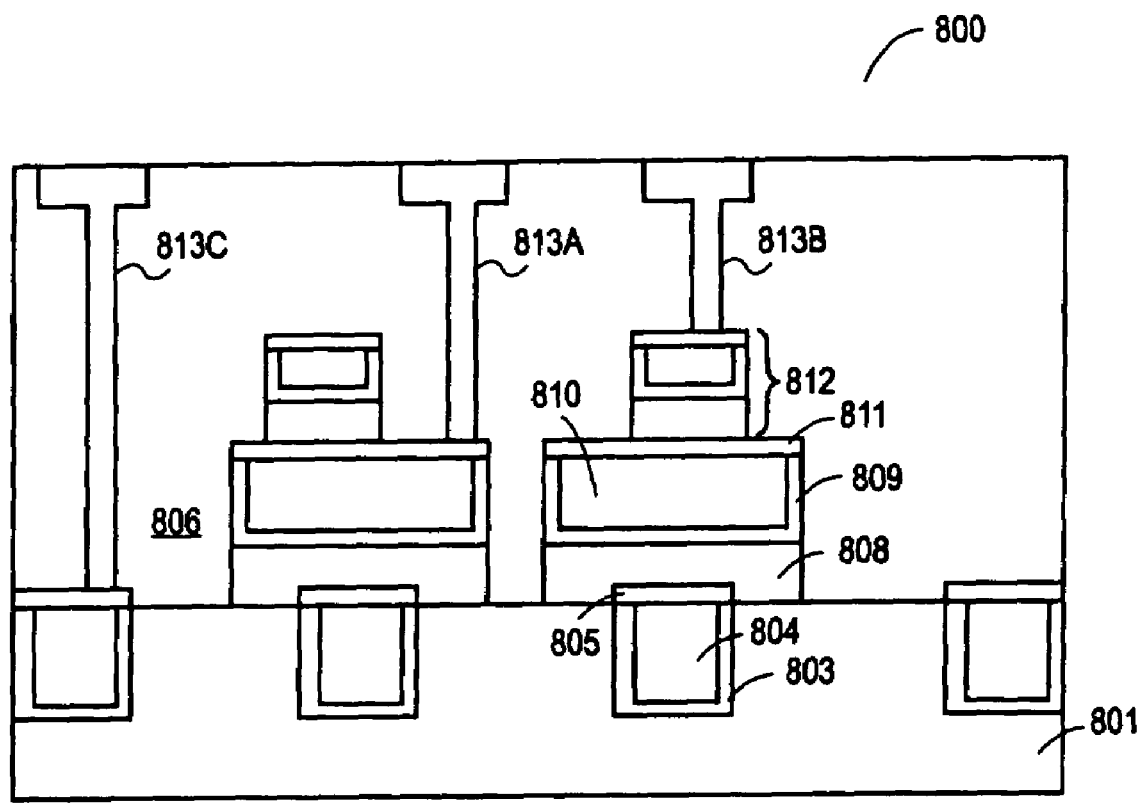
FIG. 8 illustrates a structure for forming a FPMD in accordance with one embodiment of the invention.

FIG. 8 illustrates a structure for forming a FPMD in accordance with one embodiment of the invention. Structure 800, shown in FIG. 8, includes a substrate 801 having trenches with a barrier layer 803 deposited therein and filled with a metal 804. The metal layer consisting of barrier layer 803 and metal 804 forms the bottom electrode of a FPMD and is capped with a diffusion barrier 805.

Substrate 801 also has an ILD layer 806 deposited thereon. ILD layer 806 has a trench formed therein that contains FPF 808, a diffusion barrier layer 809 deposited on the FPF 808, and a metal 810 deposited upon the diffusion barrier layer 809. Metal layer 810 forms the top electrode of a FPMD. Metal layer 810 is capped with a diffusion barrier layer 811. Structure 800 has other FPMDs formed therein, shown for example as FPMD 812, as well as vias extending to the FPMDs, shown for example as vias 813a, 813b, and 813c. For one embodiment, the trenches and vias of structure 800 are formed using a trench-first dual damascene process. Alternatively, a typical prior art process consisting of etching a via and sputtering metal may be used to form the vias of structure 800. In accordance with various alternative embodiments of the invention a trench-first dual damascene process may be used to form trenches and vias to connect conventionally produced FMPDs of the prior art.

A typical FPMD chip consists of several vertically-stacked structures similar to structure 800 of FIG. 8.

GENERAL MATTERS

Embodiments of the invention provide methods and apparatuses for effectively producing FPMDs. For one embodiment processes are employed that do not degrade the FPF nor cause substantial non-planarity of the substrate as is the case with prior art techniques. As discussed above, the process for producing FPMDs in accordance with various embodiments of the invention result in planarization of less than 5%, in contrast with prior art schemes yielding planarization of no less than 30%.

Embodiments of the invention have been described in the context of a damascene metallization technique. Various alternative embodiments could be applied to other metallizations techniques as well (e.g., sputtering), having processes that do not cause significant degradation of the FPF and substantially maintain substrate planarity.

Embodiments of the invention include various operations. Many of the methods are described in their most basic form, but operations can be added to or deleted from any of the methods without departing from the basic scope of the invention. For example, the operation 210 of process 200, described in FIG. 2 in which a diffusion barrier layer is deposited to prevent the metal from diffusing into the ILD or FPF layer may be omitted if a metal is used that does not detrimentally diffuse into the ILD material and does not detrimentally react with the FPF.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A system comprising:
    a processor;
    a memory device coupled to the processor, the memory device including one or more ferroelectric polymer memory blocks formed within a substrate, each ferroelectric polymer memory block having a bottom electrode, an etched dielectric layer deposited on the bottom electrode, the etched dielectric layer having a trench formed therein such that the bottom electrode is exposed, a ferroelectric polymer film (FPF) layer deposited on the substrate such that the trench is at least partially filled with the ferroelectric polymer film (FPF), the ferroelectric polymer film (FPF) covering the bottom electrode, and a top electrode wherein a surface comprised of the top electrode and the dielectric layer is planarized to a tolerance of less than 10%.

2. The system of claim 1 wherein the bottom electrode is formed from a metal, at least one of the ferroelectric polymer memory blocks further comprising:
    a diffusion barrier layer disposed between the bottom electrode and the ferroelectric polymer film (FPF) of the at least one memory block.

3. The system of claim 2 wherein the diffusion barrier layer is a conductive material that adheres well to the ferroelectric polymer film (FPF) and does not interact with or outgas into the ferroelectric polymer film (FPF).

4. The system of claim 3 wherein the diffusion barrier layer is selected from the group consisting of cobalt and nickel.

5. The system of claim 1, at least one of the ferroelectric polymer memory blocks further comprising;
    a second diffusion barrier layer disposed between the ferroelectric polymer film (FPF) and the top electrode of the at least one memory block.

6. The system of claim 5 wherein the second diffusion barrier layer is deposited using an evaporation process.

* * * * *